(12) United States Patent
Jeong

(10) Patent No.: US 7,817,493 B2
(45) Date of Patent: Oct. 19, 2010

(54) SEMICONDUCTOR MEMORY APPARATUS AND METHOD OF DRIVING THE SAME

(75) Inventor: Young-Han Jeong, Ichon (KR)

(73) Assignee: Hynix Semiconductor Inc. (KR)

( * ) Notice: Subject to any disclaimer, the term of this patent is extended or adjusted under 35 U.S.C. 154(b) by 306 days.

(21) Appl. No.: 12/025,538

(22) Filed: Feb. 4, 2008

(65) Prior Publication Data

US 2009/0097341 A1 Apr. 16, 2009

(30) Foreign Application Priority Data

Oct. 10, 2007 (KR) ...................... 10-2007-0102096

(51) Int. Cl.
*G11C 8/00* (2006.01)
(52) U.S. Cl. .................... 365/233.1; 365/194; 365/191; 365/233.12; 365/233.11; 365/233.14; 365/233.15
(58) Field of Classification Search .............. 365/233.1, 365/194, 191, 233.11, 233.12, 233.14, 233.15
See application file for complete search history.

(56) References Cited

U.S. PATENT DOCUMENTS

| 6,525,988 | B2 | 2/2003 | Ryu et al. |
| 6,836,437 | B2 | 12/2004 | Li et al. |
| 6,956,922 | B2 * | 10/2005 | Weldon et al. .............. 375/373 |
| 2002/0083289 | A1 * | 6/2002 | Ryoo et al. .................. 711/200 |
| 2004/0212406 | A1 | 10/2004 | Jung |
| 2006/0020835 | A1 | 1/2006 | Samson et al. |
| 2007/0146029 | A1 * | 6/2007 | Parikh ........................ 327/175 |

FOREIGN PATENT DOCUMENTS

| JP | 2005-251370 | 9/2005 |
| KR | 1020060082498 | 7/2006 |
| KR | 1020060087009 | 8/2006 |

* cited by examiner

*Primary Examiner*—Hoai V Ho
*Assistant Examiner*—Fernando N Hidalgo
(74) *Attorney, Agent, or Firm*—Baker & McKenzie LLP

(57) ABSTRACT

A semiconductor memory apparatus according to an embodiment of the invention includes a delay enable unit that generates a delay enable signal in response to an external ODT signal and an idle signal, a delay selecting unit that outputs the idle signal or a delay idle signal, which is obtained by delaying the idle signal by a first delay time, in response to the delay enable signal, and a DLL clock control unit that generates a control signal in response to the idle signal or the delay idle signal during a slow power down exit mode.

15 Claims, 6 Drawing Sheets

SEMICONDUCTOR MEMORY APPARATUS AND METHOD OF DRIVING THE SAME

CROSS-REFERENCES TO RELATED APPLICATION

The present application claims priority under 35 U.S.C. 119(a) to Korean Patent Application number 10-2007-0102096, filed on Oct. 10, 2007, in the Korean Intellectual Property Office, the contents of which are incorporated herein by reference in their entirety as if set forth in full.

BACKGROUND

1. Technical Field

The embodiments described herein relate to a semiconductor integrated circuit, and more particularly, to a semiconductor memory apparatus and a method for driving the same.

2. Related Art

A conventional semiconductor memory apparatus includes a DLL (Delay Locked Loop) clock control unit 10, a DLL clock generating unit 20, and a synchronizing unit 30, as shown in FIG. 1.

The DLL clock control unit 10 generates a control signal "ctrl" in response to an idle signal "idle," a power down exit mode signal "SPPD_A12," and a clock enable signal "CKE." When the clock enable signal "CKE" is disabled, the semiconductor memory apparatus enters a power down mode. The idle signal idle is an internal precharge signal that is enabled a predetermined time after the semiconductor memory apparatus enters the power down mode. The type of power down exit mode is determined according to whether the power down exit mode signal "SPPD_A12" is enabled or not. For example, when the power down exit mode signal "SPPD_A12" is enabled, the semiconductor memory apparatus operates in a slow power down exit mode. Alternatively, when the power down exit mode signal "SPPD_A12" is disabled, the semiconductor memory apparatus operates in a fast power down exit mode.

The clock enable signal "CKE" is disabled when the power down exit mode signal "SPPD_A12" is enabled. That is, if the semiconductor memory apparatus enters the slow power down exit mode, the DLL clock control unit 10 disables the control signal "ctrl" when the idle signal "idle" is enabled.

When the control signal "ctrl" is enabled, the DLL clock generating unit 20 generates a DLL clock "DLL_CLK" in response to a clock signal "CLK." When the control signal "ctrl" is disabled, the DLL clock generating unit 20 stops generation of the DLL clock "DLL_CLK."

The synchronizing unit 30 synchronizes an external ODT (on-die termination) signal "ODT_ext" with the DLL clock signal "DLL_CLK," and outputs it as an internal ODT signal "ODT_int." In this case, the external ODT signal "ODT_ext" is input from outside the semiconductor memory apparatus. The internal ODT signal "ODT_int" is output by synchronizing the external ODT signal "ODT_ext" with the DLL clock signal "DLL_CLK" and then used in the semiconductor memory apparatus. During an enable period of the internal ODT signal "ODT_int," the semiconductor memory apparatus performs a termination operation.

When the clock enable signal "CKE" is disabled, the semiconductor memory apparatus enters a power down mode. When the power down exit mode signal "SPPD_A12" is enabled, the semiconductor memory apparatus enters a slow power down exit mode, which is one type of power down exit mode. After a predetermined time from the disabling of the clock enable signal "CKE," the idle signal "idle" is enabled at a high level. The external ODT signal "ODT_ext" is input to the semiconductor memory apparatus after the clock enable signal "CKE" is disabled. The control signal "ctrl" is disabled when the idle signal "idle" is enabled. The internal ODT signal "ODT_int" is enabled at a high level after two cycles of the DLL clock signal "DLL_CLK."

Since the enable timing of the internal ODT signal "ODT_int" is later than the enable timing of the external ODT signal "ODT_ext" by two cycles of DLL clock signal "DLL_CLK," as illustrated in FIG. 2, the disable timing of the internal ODT signal "ODT_int" should be later than the disable timing of the external ODT signal "ODT_ext" by the two cycles of the DLL clock signal "DLL_CLK." However, the control signal "ctrl" is disabled at the enable timing of the idle signal "idle," and the transition of the DLL clock signal "DLL_CLK" is stopped. In this case, since the transition of the DLL clock signal "DLL_CLK" is stopped, the internal ODT signal "ODT_int" is not disabled. Accordingly, in the general semiconductor memory apparatus, a sufficient margin is required between the disable timing of the external ODT signal "ODT_ext" input from outside of semiconductor memory apparatus during the slow power down exit mode and the enable timing of the idle signal "idle."

As such, in the general semiconductor memory apparatus, when a sufficient margin is not maintained between the disable timing of the external ODT signal "ODT_ext" input during the slow power down exit mode and the enable timing of the idle signal "idle, the internal ODT signal "ODT_int" is not disabled.

SUMMARY

A semiconductor memory apparatus that can be configured to generate an internal ODT signal, which is synchronized with a DLL clock and normally disabled, even when a sufficient margin is not ensured between the disable timing of an external ODT signal during a slow power down exit mode and the enable timing of an idle signal "idle, and methods for driving the same are disclosed herein.

According to one aspect, a semiconductor memory apparatus can include a delay enable unit that can be configured to generate a delay enable signal in response to an external ODT signal and an idle signal, a delay selecting unit can be configured to output the idle signal or a delay idle signal, which is obtained by delaying the idle signal by a first delay time, in response to the delay enable signal, and a DLL clock control unit that can be configured to generate a control signal in response to the idle signal or the delay idle signal during a slow power down exit mode.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
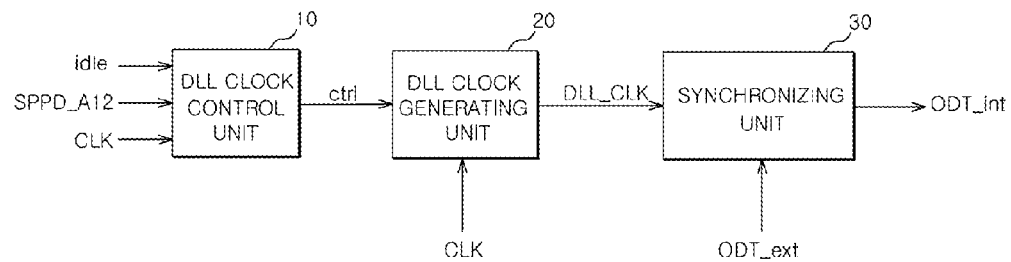
FIG. 1 is a block diagram illustrating an exemplary semiconductor memory apparatus.
Figure 2:
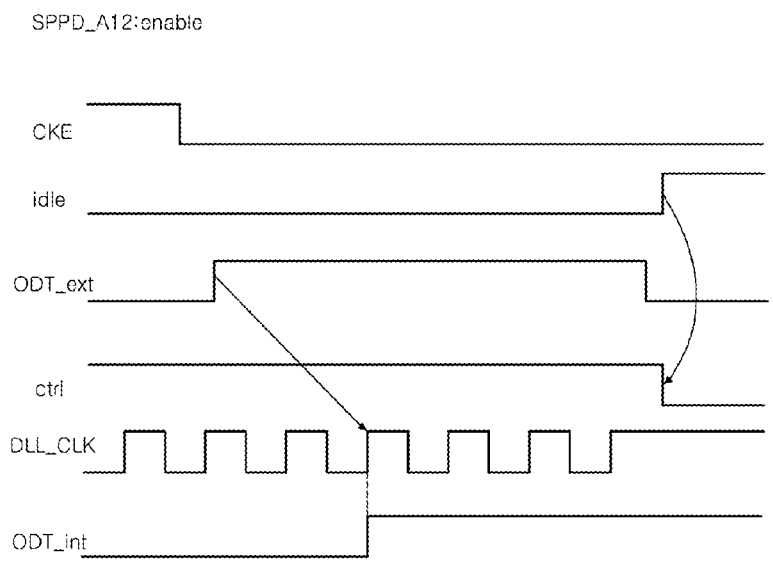
FIG. 2 is a timing chart illustrating the operation of the semiconductor memory apparatus shown in FIG. 1.
Figure 3:
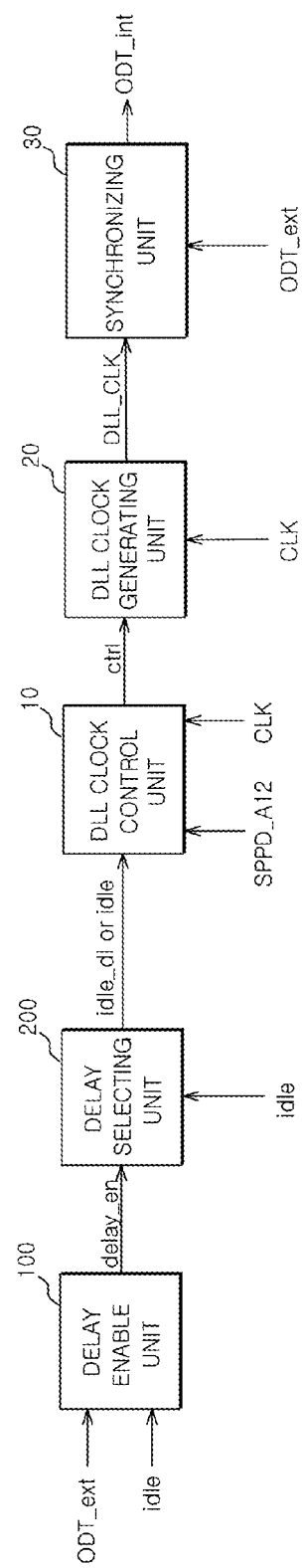
FIG. 3 is a block diagram illustrating a semiconductor memory apparatus, in accordance with one embodiment.

A semiconductor memory apparatus according to one embodiment can include a DLL clock control unit 10, a DLL clock generating unit 20, a synchronizing unit 30, a delay enable unit 100, and a delay selecting unit 200, as shown in FIG. 3.

The delay enable unit 100 can be configured to generate a delay enable signal "delay_en" in response to the transition timing of an external ODT signal "ODT_ext" and an idle signal "idle."

When the delay enable signal "delay_en" is enabled, the delay selecting unit 200 can be configured to output a delay idle signal "idle_dl" that can be obtained by delaying the idle signal "idle." Meanwhile, the delay selecting unit 200 can be further configured to output the idle signal "idle" when the delay enable signal "delay_en" is disabled.

Then, the semiconductor memory apparatus can enter a slow power down exit mode. That is, a clock enable signal "CKE" can be disabled while the power down exit mode selection signal "SPPD_A12" is enabled. At this time, the DLL clock control unit 10 can be configured to disable a control signal "ctrl" at the enable timing of the idle signal "idle or the delay idle signal "idle_dl." The power down exit mode selection signal "SPPD_A12" can be an MRS (Mode Register Set) signal. When the power down exit mode selection signal "SPPD_A12" is enabled, the semiconductor memory apparatus can be configured to enter the slow power down exit mode, and when the power down exit mode selection signal "SPPD_A12" is disabled, the semiconductor memory apparatus can be configured to enter a fast power down exit mode.

When the enabled control signal "ctrl" is input, the DLL clock generating unit 20 can be configured to generate a DLL clock "DLL_CLK" in response to a clock signal "CLK." The DLL clock control unit 10 can be further configured to stop generation of the DLL clock signal "DLL_CLK" when the control signal "ctrl" is disabled.

The synchronizing unit 30 can be configured to synchronize the external ODT signal "ODT_ext" with the DLL clock signal "DLL_CLK" and output it as an internal ODT signal "ODT_int."

Figure 4:
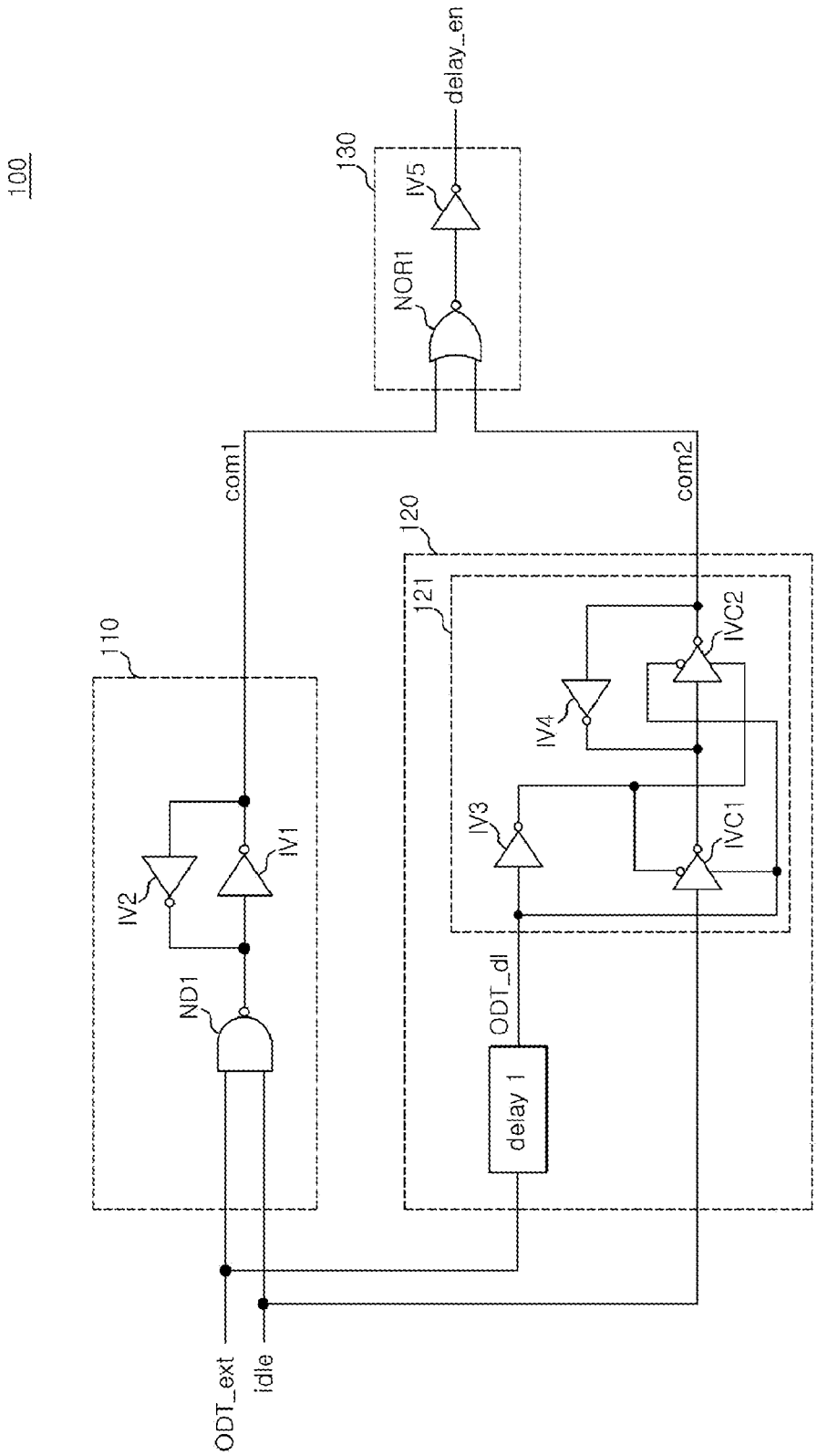
FIG. 4 is a circuit diagram illustrating a detailed structure of a delay enable unit that can be included in the apparatus shown in FIG. 3, in accordance with one embodiment.

As shown in FIG. 4, the delay enable unit 100 can include a first timing comparator 110, a second timing comparator 120, and a signal combiner 130.

The first timing comparator 110 can be configured to output a first comparison signal "com1" at a high level, when the idle signal "idle" is enabled at a high level during an enable period of the external ODT signal "ODT_ext" at a high level.

The first timing comparator 110 can include a first NAND gate (ND1), and first and second inverters (IV1) and (IV2). The first NAND gate (ND1) can be configured to receive the external ODT signal "ODT_ext," and the idle signal "idle." The first inverter (IV1) can be configured to invert an output signal of the first NAND gate (ND1) and output the first comparison signal "com1." The second inverter (IV2) can be configured to invert an output signal of the first inverter (IV1) and output it to the first inverter (IV1).

The second timing comparator 120 can include a first delay delay1 and a detector 121.

The second timing comparator 120 can be configured to output a level of the idle signal "idle" as a level of the second comparison signal "com2," when the delayed external ODT signal is disabled at a low level.

The first delay (delay1) can be configured to delay the external ODT signal "ODT_ext" and generate a delay signal "ODT_dl."

The detector 121 can be configured to output a level of the idle signal "idle" as the level of the second comparison signal "com2," when the delay signal "ODT_dl" is disabled.

The detector 121 can include third and fourth inverters (IV3) and (IV4), and first and second control inverters (IVC1) and (IVC2). The third inverter (IV3) can be configured to receive the delay signal "ODT_dl." The first control inverter (IVC1) can include a first control terminal that can be configured to receive an output signal of the third inverter (IV30, a second control terminal that can be configured to receive the delay signal "ODT_dl," and an input terminal that can be configured to receive the idle signal "idle." The second control inverter (IVC2) can include a first control terminal that can be configured to receive the delay signal "ODT_dl," a second control terminal that can be configured to receive the output signal of the third inverter (IV3), an input terminal that can be configured to receive an output signal of the first control inverter (IVC1), and an output terminal that can be configured to output the second comparison signal "com2." The fourth inverter (IV4) can include an input terminal that can be configured to receive an output signal of the second control inverter (IVC2), and an output terminal that can be configured to output an output signal to the second control inverter (IVC2).

The signal combiner 130 can be configured to generate the delay enable signal "delay_en," which is enabled at a high level when any one of the first comparison signal "com1" and the second comparison signal "com2" is enabled at a high level.

The signal combiner 130 can include a NOR gate (NOR1) and a fifth inverter (IV5). The NOR gate (NOR1) can be configured to receive the first and second comparison signals "com1" and "com2." The fifth inverter (IV5) can be configured to invert an output signal of the NOR gate (NOR1) and output the delay enable signal "delay_en."

Figure 5:
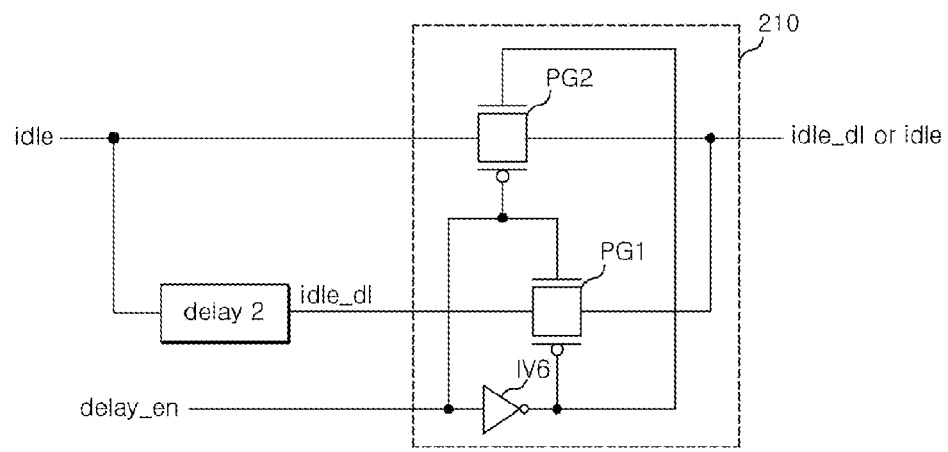
FIG. 5 is a circuit diagram illustrating a detailed structure of a delay selecting unit that can be included in the apparatus show in FIG. 3, in accordance with one embodiment.

As shown in FIG. 5, the delay selecting unit 200 can include a second delay (delay2) and a signal selector 210.

The second delay (delay2) can be configured to delay the idle signal "idle" and generate the delay idle signal "idle_dl."

The signal selector 210 can be configured to output the idle signal "idle" or the delay idle signal "idle_dl" in response to the delay enable signal "delay_en."

The signal selector 210 can include first and second pass gates (PG1) and (PG2), and a sixth inverter (IV6). The sixth inverter (IV6) can be configured to receive the delay enable signal "delay_en." The first pass gate (PG1) can include a first control terminal that can be configured to receive the delay enable signal "delay_en," a second control terminal that can be configured to receive an output signal of the sixth inverter (IV6), and an input terminal that can be configured to receive the delay idle signal "idle_dl." The second pass gate (PG2) can include a first control terminal that can be configured to receive the output signal of the sixth inverter (IV6), a second control terminal that can be configured to receive the delay enable signal "delay_en," and an input terminal that can be configured to receive the idle signal "idle." At this time, a node at which the output terminals of the first pass gate (PG1) and the second pass gate (PG2) are connected can be an output terminal of the signal selector 210.

Figure 6:
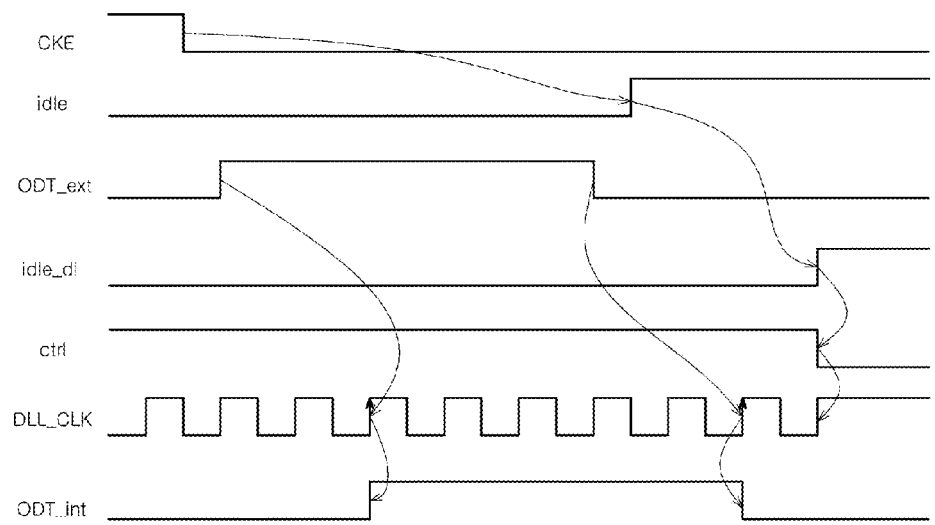
FIGS. 6 and 7 are timing charts illustrating the operation of the semiconductor memory apparatus of FIG. 3.
Figure 7:
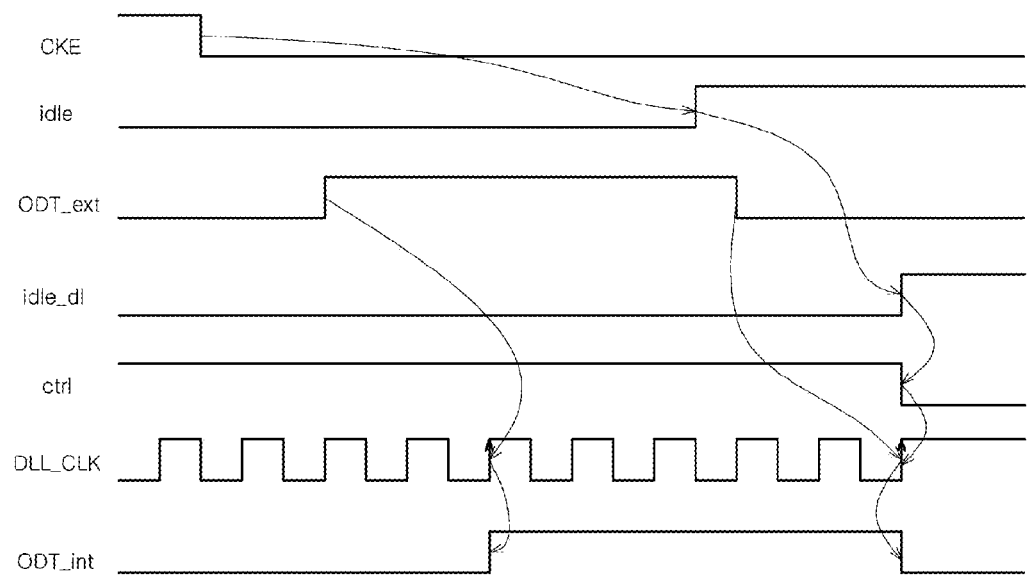

Various embodiments of the operation of the semiconductor memory apparatus that has the above-described structure will be described with reference to FIGS. 6 and 7. FIGS. 6 and 7 show a case in which the semiconductor memory apparatus can be configured to enter a slow power down exit mode due to the power down exit mode selection signal "SPPD_A12," when the clock enable signal "CKE" is disabled at a low level and the semiconductor memory apparatus enters a power down mode.

Specifically, FIG. 6 shows the situation in which a sufficient margin is not ensured after the external ODT signal "ODT_ext" is disabled at a low level and the idle signal "idle" is enabled at a high level.

Referring to FIG. 4, the first delay (delay1) can be configured to delay the external ODT signal "ODT_ext" and generate the delay signal "ODT_dl." The detector 121 can be configured to output a level of the idle signal "idle" at timing when the delay signal "ODT_dl" can be disabled. Accordingly, since the level of the idle signal "idle" is at a high level at the disable timing of the delay signal "ODT_dl," the second comparison signal "com2" is output at a high level. At this time, the delay time of the first delay (delay1) is at least a minimum time (for example, two cycles of the DLL clock signal "DLL_CLK") that should be ensured until the idle signal "idle" is enabled at a high level after the external ODT signal "ODT_ext" is disabled.

The detector 121 can be configured to output the high-level second comparison signal "com2," when the idle signal "idle" is enabled at a high level resulting in a state where sufficient margin is not ensured after the external ODT signal "ODT_ext" is disabled.

When the second comparison signal "com2" becomes a high level, the signal combiner 130 can be configured to enable the delay enable signal "delay_en" at a high level.

Referring to FIG. 5, the second delay (delay2) can be configured to delay the idle signal "idle" and generate the delay idle signal "idle_dl." The signal selector 210 can be configured to output the delay idle signal "idle_dl" when the delay enable signal "delay_en" is enabled at a high level.

In FIG. 6, at the time when the delay idle signal "idle_dl" is enabled at a high level, the control signal "ctrl" can be disabled at a low level. If the control signal "ctrl" is disabled at a low level, the transition of the DLL clock signal "DLL_CLK" is stopped. However, the internal ODT signal "ODT_int" can be disabled at a low level before the transition of the DLL clock signal "DLL_CLK" is stopped.

FIG. 7 shows the case in which the idle signal "idle" is enabled at a high level before the external ODT signal "ODT_ext" is disabled at a low level.

In FIG. 4, the first timing comparator 110 can be configured to generate the first comparison signal "com1," which can be enabled at a high level when the idle signal "idle" is enabled at a high level before the external ODT signal "ODT_ext" is disabled at a low level, that is, when an enable period of the external ODT signal "ODT_ext" overlaps an enable period of the idle signal "idle."

The signal combiner 130 can be configured to output the delay enable signal "delay_en," which can be enabled at a high level when the first comparison signal "com1" is enabled at a high level.

In FIG. 5, the signal selector 210 can be configured to output the delay idle signal "idle_dl" because the delay enable signal "delay_en" is enabled at a high level.

In FIG. 7, at timing when a level of the delay idle signal "idle_dl" is transited to a high level, the control signal "ctrl" can be disabled at a low level. When the control signal "ctrl" is disabled at a low level, the transition of the DLL clock signal "DLL_CLK" can be stopped. Before the transition of the DLL clock signal "DLL_CLK" is stopped, the internal ODT signal "ODT_int" can be disabled at a low level.

According to one embodiment, if the idle signal "idle" is enabled in a state where sufficient margin is not ensured after the external ODT signal "ODT_ext" is disabled, the idle signal "idle" can be delayed to delay the disable timing of the control signal "ctrl." Accordingly, the transition of the DLL clock signal "DLL_CLK" can be stopped and the internal ODT signal "ODT_int" can be disabled in synchronization with the DLL clock signal "DLL_CLK."

Accordingly, in the various embodiments of the semiconductor memory apparatus and the method of driving the same, the internal ODT signal, which is synchronized with the DLL clock and normally disabled, can be generated during the slow power down exit mode, thereby improving reliability of the operation of the semiconductor memory apparatus.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A semiconductor memory apparatus comprising:
a delay enable unit that generates a delay enable signal by comparing an external ODT signal with an idle signal;
a delay selecting unit that outputs the idle signal or a delay idle signal, which is obtained by delaying the idle signal by a first delay time, in response to the delay enable signal; and
a DLL clock control unit that generates a control signal in response to the idle signal or the delay idle signal during a slow power down exit mode,
wherein the external ODT signal is a signal that instructs the semiconductor memory apparatus to perform a termination operation.

2. The semiconductor memory apparatus of claim 1,
wherein the delay enable unit compares transition timing of the external ODT signal with transition timing of the idle signal and generates the delay enable signal.

3. The semiconductor memory apparatus of claim 2,
wherein the delay enable unit includes:
a first timing comparator that compares enable timing of the external ODT signal with enable timing of the idle signal and generates a first comparison signal;
a second timing comparator that compares disable timing of the external ODT signal with the enable timing of the idle signal and generates a second comparison signal; and
a signal combiner that enables the delay enable signal when any one of the first comparison signal and the second comparison signal is enabled.

4. The semiconductor memory apparatus of claim 3,
wherein the first timing comparator generates the first comparison signal, which is enabled when the idle signal is enabled during an enable period of the external ODT signal.

5. The semiconductor memory apparatus of claim 3,
wherein the second timing comparator generates a delay signal by delaying the external ODT signal by a second delay time, and outputs a level of the idle signal as a level of the second comparison signal at disable timing of the delay signal.

6. The semiconductor memory apparatus of claim 5,
wherein the delay selecting unit includes a first delay that has the first delay time, the second timing comparator includes a second delay that has the second delay time, and the first delay unit has a delay time that is longer than that of the second delay unit.

7. The semiconductor memory apparatus of claim 1,
wherein the delay selecting unit outputs the idle signal when the delay enable signal is disabled and outputs the delay idle signal when the delay enable signal is enabled.

8. The semiconductor memory apparatus of claim 1,
wherein the DLL clock control unit disables the control signal at enable timing of the idle signal, when the idle signal is input, and disables the control signal at enable timing of the delay idle signal, when the delay idle signal is input.

9. The semiconductor memory apparatus of claim 1, further comprising:
 a DLL clock generating unit that generates a DLL clock in response to the control signal; and
 a synchronizing unit that synchronizes the external ODT signal with the DLL clock and outputs an internal ODT signal.

10. A method of driving a semiconductor memory apparatus, the method comprising:
 comparing disable timing of an external ODT signal that instructs the semiconductor memory apparatus to perform a termination operation with enable timing of an idle signal and outputting the idle signal or a delay idle signal, which is obtained by delaying the idle signal by a first delay time, according to the comparison result;
 generating a DLL clock during a slow power down exit mode until the idle signal or the delay idle signal is enabled; and
 synchronizing the external ODT signal with the DLL clock and outputting an internal ODT signal.

11. The method of claim 10,
wherein the comparing of the disable timing of the external ODT signal with the enable timing of the idle signal and the outputting of the idle signal or the delay idle signal includes:

comparing the disable timing of the external ODT signal with the enable timing of the idle signal and generating first and second comparison signals; and outputting the delay idle signal when the first comparison signal or the second comparison signal is enabled and outputting the idle signal when both the first comparison signal and the second comparison signal are disabled.

12. The method of claim 11,
wherein the comparing of the disable timing of the external ODT signal with the enable timing of the idle signal and the generating of the first and second comparison signals includes:

enabling the first comparison signal when the disable timing of the external ODT signal is later than the enable timing of the idle signal; and enabling the second comparison signal when disable timing of a delay ODT signal, which is obtained by delaying the external ODT signal by a second delay time, is later than the enable timing of the idle signal.

13. The method of claim 11,
wherein the outputting of the delay idle signal when the first comparison signal or the second comparison signal is enabled and the outputting of the idle signal when both the first comparison signal and the second comparison signal are disabled includes:

generating a delay enable signal when the first comparison signal or the second comparison signal is enabled; and outputting the delay idle signal when the delay enable signal is enabled and outputting the idle signal when the delay enable signal is disabled.

14. The method of claim 12,
wherein the first delay time is longer than the second delay time.

15. The method of claim 10,
wherein the generating of the DLL clock during the slow power down exit mode until the idle signal or the delay idle signal is enabled includes:

generating, when a power down exit mode signal is enabled, a control signal, which is enabled at timing at which the idle signal or the delay idle signal is enabled; and stopping generation of the DLL clock when the control signal is enabled.

* * * * *